(12) United States Patent
Lai et al.

(10) Patent No.: US 9,913,380 B2
(45) Date of Patent: Mar. 6, 2018

(54) EMBEDDED PACKAGE STRUCTURE (71) Applicant: Delta Electronics Int'l (Singapore) Pte Ltd, Singapore (SG)

(72) Inventors: Yiu-Wai Lai, Singapore (SG); Da-Jung Chen, Singapore (SG)

(73) Assignee: DELTA ELECTRONICS INT'L (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 15/490,178

(22) Filed: Apr. 18, 2017

(65) Prior Publication Data
US 2017/0347458 A1 Nov. 30, 2017

(30) Foreign Application Priority Data
May 31, 2016 (SG) .......................... 10201604384Y (51) Int. Cl.
| H05K 1/18 | (2006.01) |
| H05K 1/09 | (2006.01) |
| H05K 1/16 | (2006.01) |
| H05K 1/11 | (2006.01) |

(52) U.S. Cl.
CPC ............ *H05K 1/185* (2013.01); *H05K 1/115* (2013.01); *H05K 2201/1003* (2013.01); *H05K 2201/10015* (2013.01); *H05K 2201/10022* (2013.01)

(58) Field of Classification Search
CPC .............. H05K 1/185; H05K 1/115; H05K 2201/10015; H05K 2201/10022; H05K 2201/1003

USPC .......................... 174/257, 260, 262; 361/761
See application file for complete search history.

(56) References Cited

U.S. PATENT DOCUMENTS

| 6,628,526 | B1 | 9/2003 | Oshima et al. |
| 7,572,681 | B1 | 8/2009 | Huemoeller et al. |
| 7,738,256 | B2 | 6/2010 | Sawatari et al. |
| 8,072,769 | B2 | 12/2011 | Ieki et al. |
| 8,829,356 | B2 * | 9/2014 | Hsu ................ H01L 23/49822 174/257 |
| 9,107,290 | B1 | 8/2015 | Chen |

(Continued)

FOREIGN PATENT DOCUMENTS

EP 2357877 A1 8/2011

*Primary Examiner* — Sherman Ng
(74) *Attorney, Agent, or Firm* — Kirton McConkie; Evan R. Witt (57) ABSTRACT

An embedded package structure includes an insulation substrate, a first conductive layer, a second conductive layer, an electronic component and a passive component. The insulation substrate has a first conductive via and a second conductive via. The first conductive layer is formed on a top surface of the insulation substrate and contacted with the first conductive via. The second conductive layer is formed on a bottom surface of the insulation substrate, and contacted with the second conductive via. The electronic component is embedded within the insulation substrate. Moreover, plural conducting terminals of the electronic components are electrically connected with the first conductive layer and the second conductive layer through the first conductive via and the second conductive via. The passive component is located near a first side of the electronic component and separated from the electronic component. The passive component is at least partially embedded within the insulation substrate.

16 Claims, 9 Drawing Sheets (56) References Cited

U.S. PATENT DOCUMENTS

| | | |
|---|---|---|
| 2006/0191711 A1 | 8/2006 | Cho et al. |
| 2008/0239685 A1* | 10/2008 | Kawabe ................. H01G 4/232 |
| | | 361/782 |
| 2009/0237900 A1* | 9/2009 | Origuchi ........... H01L 23/49838 |
| | | 361/763 |
| 2012/0319258 A1 | 12/2012 | Lu et al. |
| 2013/0093069 A1 | 4/2013 | Lu et al. |
| 2013/0269986 A1* | 10/2013 | Sun .................... H01L 23/3677 |
| | | 174/252 |
| 2015/0138741 A1 | 5/2015 | Moon et al. |
| 2015/0303164 A1 | 10/2015 | Chen |

\* cited by examiner

EMBEDDED PACKAGE STRUCTURE

FIELD OF THE INVENTION

The present invention relates to a package structure, and more particularly to an embedded package structure.

BACKGROUND OF THE INVENTION

Recently, the general trends in designing electronic devices are toward small size, light weightiness and easy portability. Moreover, with increasing development of electronic industries, the internal circuitries of the electronic devices are gradually modularized. In other words, plural electronic components are integrated into a single circuit module. For example, a power module is one of the widely-used circuit modules. An example of the power module includes but is not limited to a DC-to-DC converter, a DC-to-AC converter or an AC-to-DC converter. After the electronic components (e.g. integrated circuits, capacitors, resistors, inductors, transformers, diodes and transistors) are integrated as a power module, the power module may be installed on a motherboard or a system circuit board.

Nowadays, an embedded package structure is widely adopted. The process of fabricating the conventional embedded package structure will be illustrated as follows. Firstly, an electronic component with at least one conducting terminal (e.g., an active component) is embedded within an insulation substrate. Then, at least one via is formed in the insulation substrate by a laser drilling process. After a conductive material is filled in the via, a conductive via is formed. Then, a conductive layer is formed on the insulation substrate and contacted with the conductive via. Then, a passive component is installed on the above structure, and the passive component is electrically connected with the electronic component. Since the passive component and the electronic component are electrically connected with each other through the conductive layer and the conductive via, the passive component and the electronic component are vertically arranged in a stack form. Under this circumstance, the layout area of the motherboard or the system circuit board is saved.

However, since the passive component, the electronic component and the conductive layer are arranged in the stack form, the overall thickness of the embedded package structure is large (e.g., larger than 1000 micrometer). In other words, the conventional embedded package structure is not suitable for an ultra-thin electronic product (e.g., a smart watch or a tablet computer).

SUMMARY OF THE INVENTION

An object of the present invention is to provide an embedded package structure having an electronic component and a passive component separately and horizontally embedded within an insulation substrate. Consequently, the overall thickness of the embedded package structure is reduced, and the embedded package structure is suitably applied to the ultra-thin electronic product.

Another object of the present invention is to provide an embedded package structure with a slim and easily fabricated package structure. Moreover, the embedded package structure has high power density, good electrical properties and good heat management performance.

In accordance with an aspect of the present invention, there is provided an embedded package structure. The embedded package structure includes an insulation substrate, a first conductive layer, a second conductive layer, an electronic component, a first insulation material layer, a second insulation material layer and a passive component. The insulation substrate has at least one first conductive via and at least one second conductive via. The first conductive layer is formed on a top surface of the insulation substrate. The first conductive layer is in contact with the at least first conductive via. The second conductive layer is formed on a bottom surface of the insulation substrate. The second conductive layer is in contact with the at least second conductive via. The electronic component is embedded within the insulation substrate, and includes plural first conducting terminals. The plural first conducting terminals are electrically connected with the first conductive layer and the second conductive layer through the at least one first conductive via and the at least one second conductive via, respectively. The first insulation material layer is formed on an outer surface of the first conductive layer and a part of the top surface of the insulation substrate. The second insulation material layer is formed on an outer surface of the second conductive layer and a part of the bottom surface of the insulation substrate. The passive component is located near a first side of the electronic component and separated from the electronic component. The passive component is at least partially embedded within the insulation substrate.

In accordance with another aspect of the present invention, there is provided an embedded package structure. The embedded package structure includes a dielectric substrate, an electronic component, at least a first redistribution layer, a passive component, and a second redistribution layer. The dielectric substrate has a first region and a second region adjacent to the first region. The electronic component is embedded within the first region of the dielectric substrate. The at least one first redistribution layer is formed within the first region of the dielectric substrate and electrically connected to the electronic component. The passive component is embedded within the dielectric substrate and at least partially disposed within the second region of the dielectric substrate. The second redistribution layer is disposed on a surface of the dielectric substrate, and the second redistribution layer is located in the first region and the second region and electrically connected with the passive component and the electronic component. A thickness of the passive component is larger than that of the electronic component.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
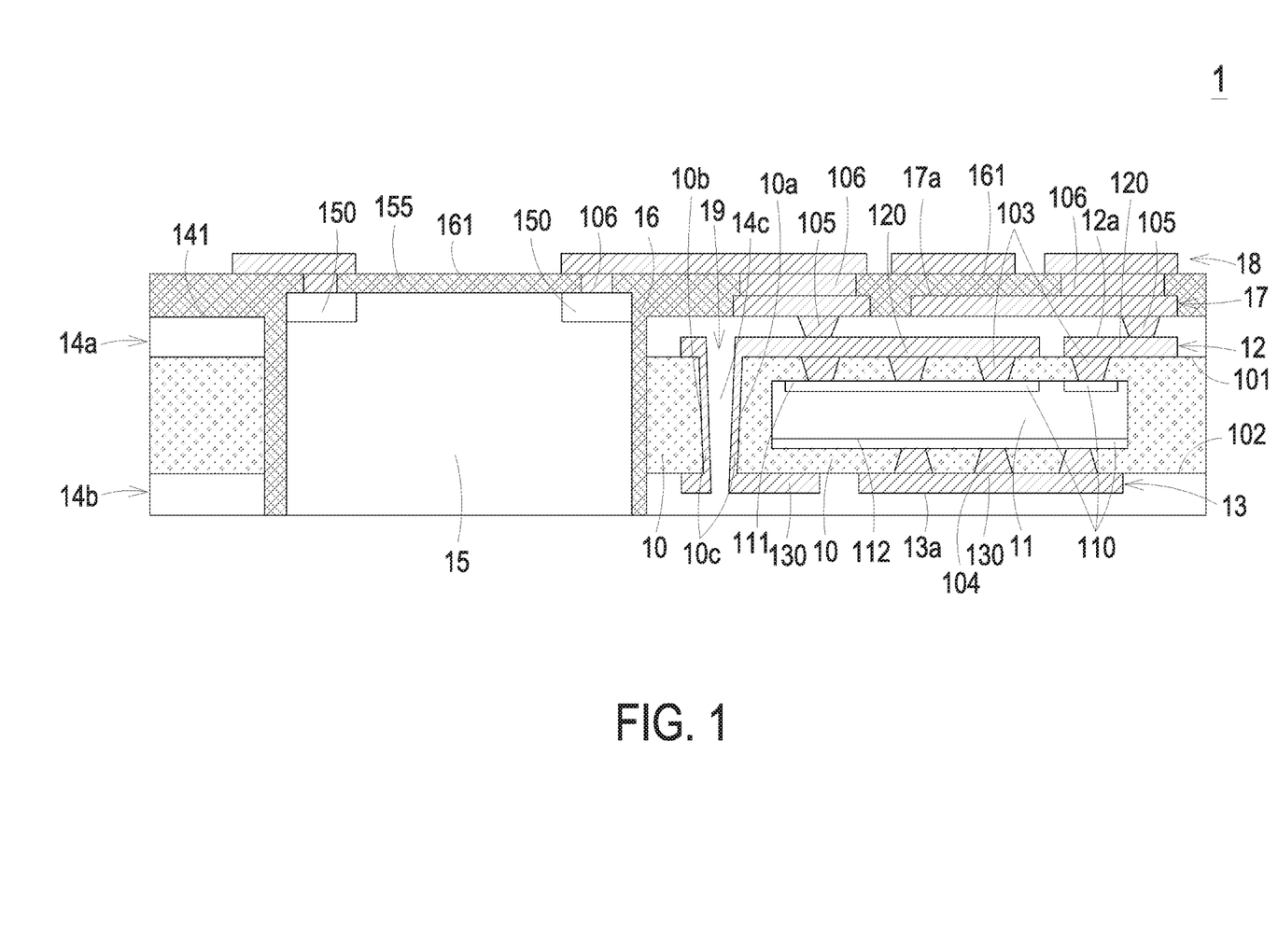
FIG. 1 is a schematic cross-sectional view illustrating an embedded package structure according to a first embodiment of the present invention.

FIG. 1 is a schematic cross-sectional view illustrating an embedded package structure according to a first embodiment of the present invention. FIGS. 2A to 2E are schematic cross-sectional views illustrating a fabricating process of the embedded package structure of FIG. 1. As shown in FIGS. 1 and 2A to 2E, the embedded package structure 1 comprises an insulation substrate 10, an electronic component 11, a first conductive layer 12, a second conductive layer 13, a first insulation material layer 14a, a second insulation material layer 14b and a passive component 15. The electronic component 11 is embedded within the insulation substrate 10, and the electronic component 11 comprises plural first conducting terminals 110. Moreover, plural conductive vias 103 and plural conductive vias 104 are formed in the insulation substrate 10. The first conductive layer 12 is formed on a top surface 101 of the insulation substrate 10. In addition, the top surface 101 of the insulation substrate 10 is partially exposed through the first conductive layer 12. The first conductive layer 12 is in contact with the plural conductive vias 103. The second conductive layer 13 is formed on a bottom surface 102 of the insulation substrate 10. In addition, the bottom surface 102 of the insulation substrate 10 is partially exposed through the second conductive layer 13. The second conductive layer 13 is in contact with the plural conductive vias 104. The first conducting terminals 110 on a top surface 111 of the electronic component 11 are in contact with the corresponding conductive vias 103. The first conducting terminal 110 on a bottom surface 112 of the electronic component 11 is in contact with the corresponding conductive vias 104. Consequently, the electronic component 11 is electrically connected with the first conductive layer 12 and the second conductive layer 13 through the plural first conducting terminals 110, the plural conductive vias 103 and the plural conductive vias 104. The first insulation material layer 14a is formed on an outer surface 12a of the first conductive layer 12 and a part of the top surface 101 of the insulation substrate 10. The second insulation material layer 14b is formed on an outer surface 13a of the second conductive layer 13 and a part of the bottom surface 102 of the insulation substrate 10. The passive component 15 is separated from the electronic component 11 and located beside the electronic component 11 along a horizontal direction. Moreover, at least a part of the passive component 15 is embedded within the insulation substrate 10. The passive component 15 has one or more second conducting terminals 150.

In this embodiment, the embedded package structure 1 further comprises an opening 15a. The opening 15a is located beside the electronic component 11. In addition, the opening 15a runs through the first insulation material layer 14a, the second insulation material layer 14b and the insulation substrate 10. At least a part of the passive component 15 is accommodated within the opening 15a. Consequently, the passive component 15 is separated from the electronic component 11 though the first insulation material layer 14a, the second insulation material layer 14b and the insulation substrate 10. Preferably but not exclusively, the opening 15a is formed after the portions of the first insulation material layer 14a, the second insulation material layer 14b and the insulation substrate 10 beside the electronic component 11 are removed by a laser drilling process. In addition, the opening 15a is larger than the passive component 15. Consequently, after the passive component 15 is accommodated within the opening 15a, a gap is formed between the passive component 15 and an inner surface of the opening 15a. In addition, the passive component 15 is at least partially embedded within the first insulation material layer 14a, the second insulation material layer 14b and the insulation substrate 10.

In this embodiment, the embedded package structure 1 further comprises a fixing structure 16, a third conductive layer 17, a fourth conductive layer 18, plural conductive edges 10c and a groove 19. The third conductive layer 17 is formed on a top surface 141 of the first insulation material layer 14a. In addition, the top surface 141 of the first insulation material layer 14a is partially exposed through the third conductive layer 17.

The fixing structure 16 is formed on the top surface 141 of the first insulation material layer 14a, an outer surface 17a of the third conductive layer 17 and an outer surface 155 of the passive component 15, and filled in the gap between the passive component 15 and the inner surface of the opening 15a. The first insulation material layer 14a, the third conductive layer 17 and the passive component 15 are combined together through the fixing structure 16. Moreover, the passive component 15 is securely fixed in the opening 15a through the fixing structure 16. In this embodiment, plural conductive channels 106 are formed in the fixing structure 16. The plural conductive channels 106 are in contact with the top surface 17a of the third conductive layer 17 and the second conducting terminals 150 of the passive component 15. The fourth conductive layer 18 is formed on a top surface 161 of the fixing structure 16. In addition, the fourth conductive layer 18 is in contact with the top surface of the plural conductive channels 106, and the top surface 161 of the fixing structure 16 is partially exposed through the fourth conductive layer 18.

In this embodiment, plural conductive vias 105 are formed in the first insulation material layer 14a. The first ends of the conductive vias 105 are in contact with the outer surface 12a of the first conductive layer 12. The second ends of the conductive vias 105 are in contact with a bottom surface of the third conductive layer 17. Moreover, the first conducting terminals 110 on the top surface 111 of the electronic component 11 are electrically connected with the corresponding conductive vias 105 through the conductive vias 103.

The groove 19 is arranged between the passive component 15 and the electronic component 11. For example, the groove 19 is formed by a laser drilling process. The groove 19 has a first wall 10a and a second wall 10b, wherein the first wall and the second wall 10b are opposed to each other. The embedded package structure 1 further comprises a third insulation material layer 14c. The third insulation material layer 14c is filled in the groove 19, and contacted with the first insulation material layer 14a and the second insulation material layer 14b. The plural conductive edges 10c are formed on the first wall 10a and the second wall 10b, and contacted with the first conductive layer 12 and the second conductive layer 13. Due to the groove 19, the isolation between the passive component 15 and the electronic component 11 is enhanced.

Preferably but not exclusively, one or more separate first conductive blocks, one or more separate second conductive blocks, one or more separate third conductive blocks and one or more fourth conductive blocks are formed by etching the first conductive layer 12, the second conductive layer 13, the third conductive layer 17 and the fourth conductive layer 18. As shown in FIG. 1, the first conductive blocks of the first conductive layer 12 are in contact with the corresponding conductive vias 103 and the corresponding conductive vias 105. The second conductive blocks of the second conductive layer 13 are in contact with the corresponding conductive vias 104. The third conductive blocks of the third conductive layer 17 are in contact with the corresponding conductive vias 105 and the corresponding conductive channels 106. The fourth conductive blocks of the fourth conductive layer 18 are in contact with the corresponding conductive channels 106. Moreover, the first conductive layer 12, the second conductive layer 13, the third conductive layer 17 and the fourth conductive layer 18 are made of copper or any other appropriate conductive material. For example, the first conductive layer 12, the second conductive layer 13, the third conductive layer 17 and the fourth conductive layer 18 are formed by an electroplating process or a depositing process. The conductive vias 103 are formed in the insulation substrate 10, exposed to the top surface 101 of the insulation substrate 10, and contacted with the first conductive layer 12. The conductive vias 104 are formed in the insulation substrate 10, exposed to the bottom surface 102 of the insulation substrate 10, and contacted with the second conductive layer 13. For example, after plural vias are formed in the insulation substrate 10 by a laser drilling process, a mechanical drilling process or a photolithography process and a conductive material is formed in the plural vias by a filling process or an electroplating process, the plural conductive vias 103 and the plural conductive vias 104 are formed. The conductive vias 105 are formed in the first insulation material layer 14a, exposed to the top surface 141 of the first insulation material layer 14a, and contacted with the third conductive layer 17. The method of forming the conductive vias 105 is similar to the method of forming the conductive vias 103 and the conductive vias 104, and is not redundantly described herein.

In an embodiment, the insulation substrate 10 is made of prepreg material or any other appropriate insulation material with high thermal conductivity. Preferably but not exclusively, the first insulation material layer 14a, the second insulation material layer 14b and the third insulation material layer 14c are made of solder mask material, and the fixing structure 16 is made of one or more insulation materials, such as a solder mask material.

The electronic component 11 is an active component. An example of the electronic component 11 includes but is not limited to an integrated circuit (IC) chip, an integrated power component, a metal-oxide-semiconductor field-effect transistor (MOSFET), an insulated-gate bipolar transistor (IGBT). The electronic component 11 is arranged between the plural conductive vias 103 and the plural conductive vias 104. The first conducting terminals 110 on the top surface 111 of the electronic component 11 are electrically connected with the corresponding first conductive blocks of the first conductive layer 12 through the corresponding conductive vias 103. The first conducting terminal 110 on the bottom surface 112 of the electronic component 11 are electrically connected with the corresponding second conductive blocks of the second conductive layer 13 through the corresponding conductive vias 104. An example of the passive component 15 includes but is not limited to a capacitor, a resistor or an inductor. In an embodiment, the passive component 15 comprises a choke. The first conducting terminals 150 of the passive component 15 are electrically connected with the corresponding fourth conductive blocks of the fourth conductive layer 18 through the corresponding conductive channels.

In this embodiment, the conductive vias 105 and the third conductive layer 17 are collaboratively formed as a redistribution layer (RDL), and the conductive channels 106 and the fourth conductive layer 18 are collaboratively formed as another re-distribution layer (RDL). The fourth conductive blocks of the fourth conductive layer 18 may be served as contact pads. Consequently, the embedded package structure can be electrically connected with a system circuit board (not shown) through the contact pads.

Namely, the embedded package structure 1 includes a dielectric substrate, an electronic component 11, at least a first redistribution layer, a passive component 15, and a second redistribution layer. The dielectric substrate has a first region and a second region adjacent to the first region. The dielectric substrate comprises an insulation substrate 10, a first insulation material layer 14a, a second insulation material layer 14b and a fixing structure 16. The electronic component 11 is embedded within the first region of the dielectric substrate. The at least one first redistribution layer is formed within the first region of the dielectric substrate and electrically connected to the electronic component 11. The passive component 15 is embedded within the dielectric substrate and at least partially disposed within the second region of the dielectric substrate. The second redistribution layer is disposed on a surface of the dielectric substrate, and the second redistribution layer is located in the first region and the second region and electrically connected with the passive component 15 and the electronic component 11. A thickness of the passive component 15 is larger than that of the electronic component 11.

Hereinafter, a process of fabricating a package structure of the embedded package structure 1 of FIG. 1 will be illustrated with reference to FIGS. 2A to 2E.

Figure 2A:
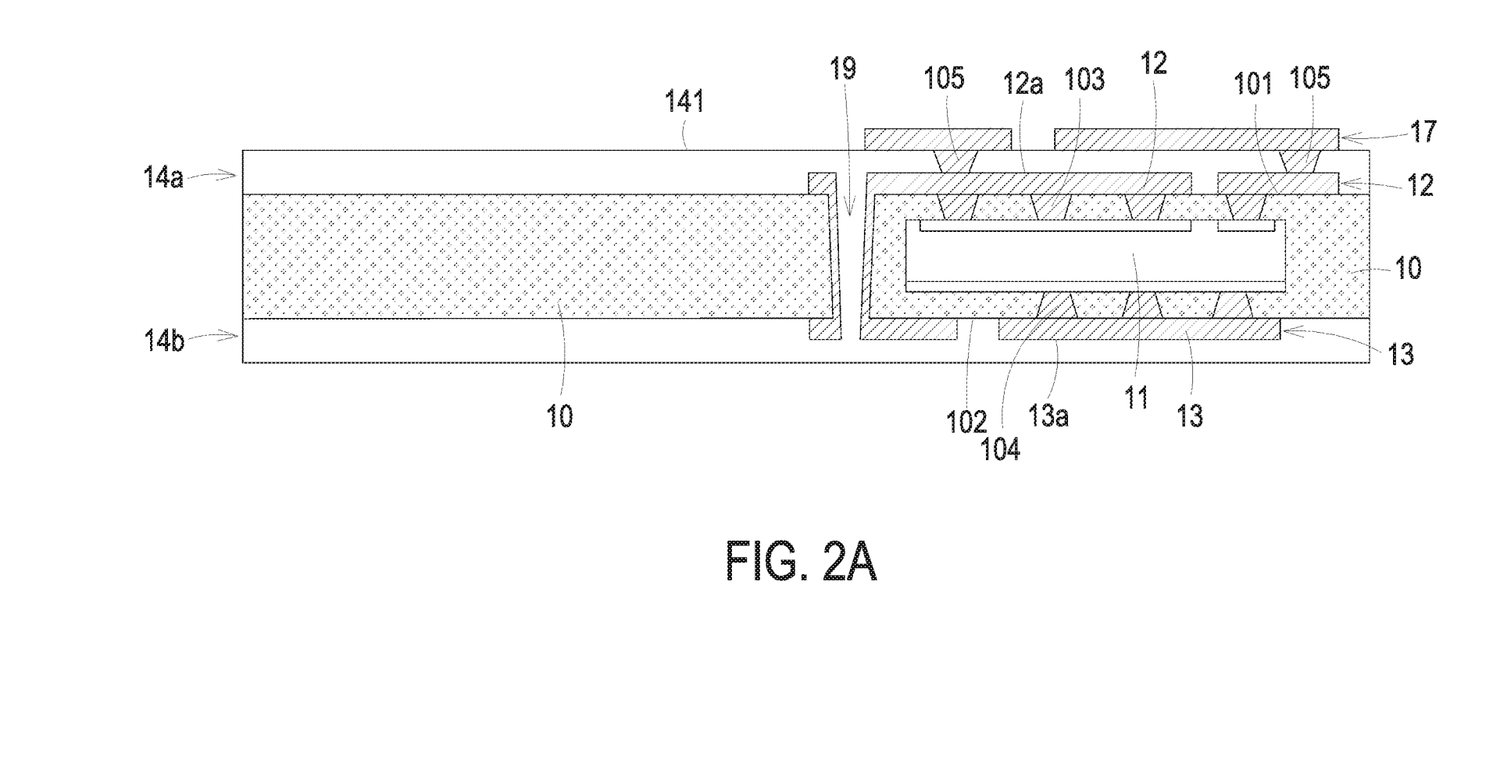
FIGS. 2A-2E are schematic cross-sectional views illustrating a fabricating process of the embedded package structure of FIG. 1.

Firstly, as shown in FIG. 2A, a semi-package unit of the embedded package structure 1 is provided. For forming the semi-package unit, the electronic component 11 is embedded within the insulation substrate 10. The plural first vias 103 are in contact with the corresponding first conductive blocks of the first conductive layer 12 on the top surface 101 of the insulation substrate 10, and the plural second vias 104 are in contact with the corresponding second conductive blocks of the second conductive layer 13 on the bottom surface 102 of the insulation substrate 10. Then, the first insulation material layer 14a is formed on a part of the top surface 101 of the insulation substrate 10 and the outer surface 12a of the first conductive layer 12, and the second insulation material layer 14b is formed on a part of the bottom surface 102 of the insulation substrate 10 and the outer surface 13a of the second conductive layer 13. Then, the plural conductive vias 105 are formed in the first insulation material layer 14a and contacted with the corresponding first conductive blocks of the first conductive layer 12. Then, the third conductive layer 17 is formed on the top surface 141 of the first insulation material layer 14a, wherein the corresponding third conductive blocks of the third conductive layer 17 are contacted with the corresponding third vias 105.

Figure 2B:
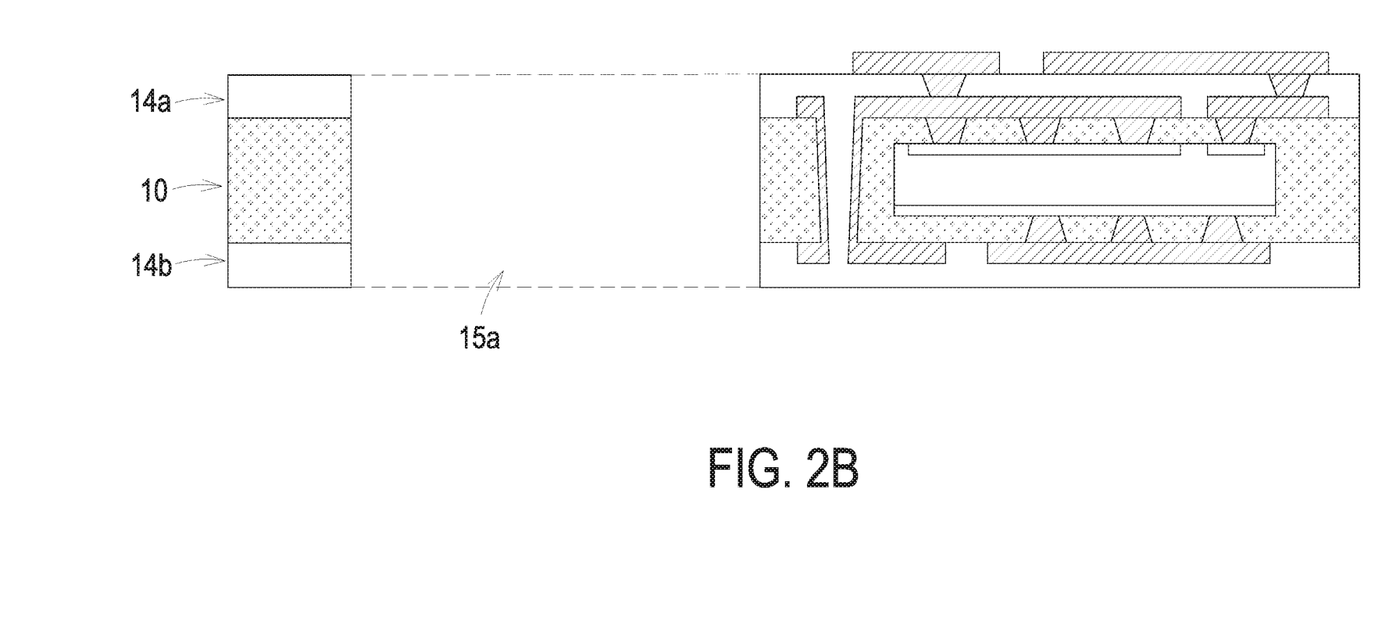

Then, as shown in FIG. 2B, the opening 15a is formed in the first insulation material layer 14a, the insulation substrate 10 and the second insulation material layer 14b. For example, the opening 15a is formed by a laser drilling process.

Figure 2C:
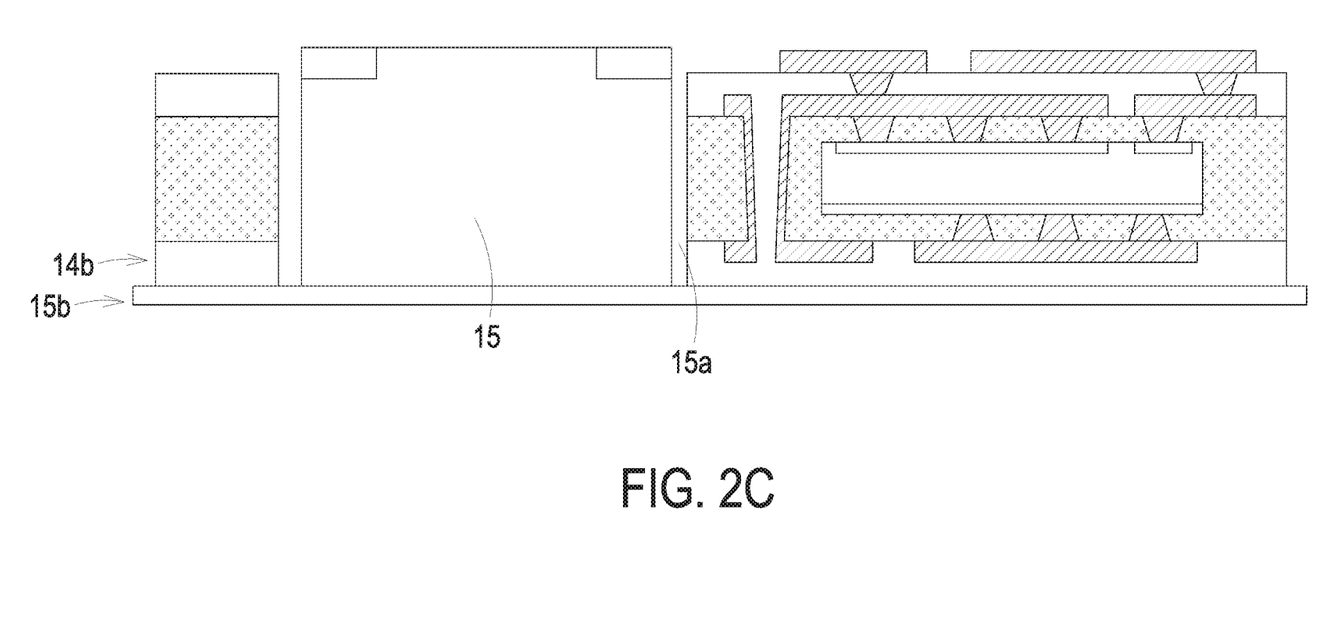

Then, as shown in FIG. 2C, the passive component 15 is placed within the opening 15a. In particular, after a thermal tape 15b is attached on the bottom surface of the second insulation material layer 14b, the passive component 15 is placed within the opening 15a and attached on the thermal tape 15b.

Figure 2D:
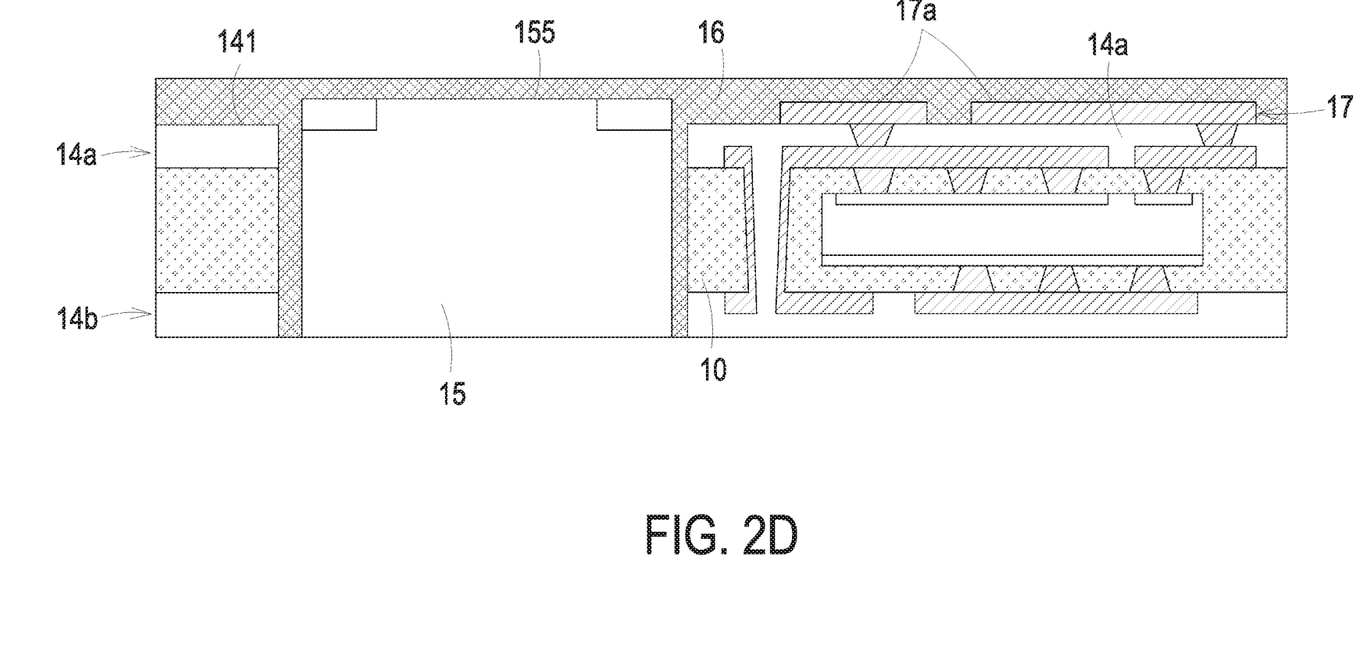

Then, as shown in FIG. 2D, the fixing structure 16 is formed on the top surface 141 of the first insulation material layer 14a, the outer surface 17a of the third conductive layer 17 and the outer surface 155 of the passive component 15, and filled in the gap between the passive component 15 and the inner surface of the opening 15a. Since the passive component 15 is encapsulated by the fixing structure 16, the passive component 15 is securely fixed within the opening 15a. Then, the thermal tape 15b is removed.

Figure 2E:
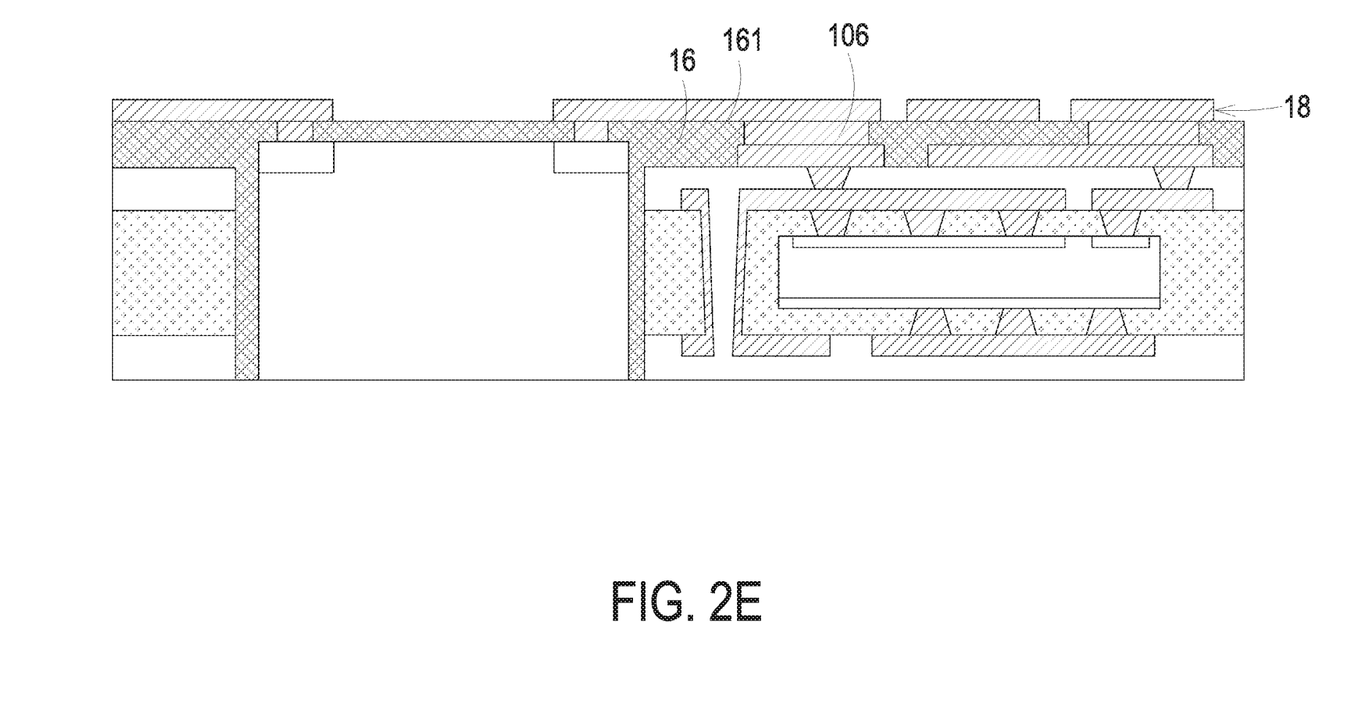

Then, as shown in FIG. 2E, the fourth conductive layer 18 is formed on the top surface 161 of the fixing structure 16 and contacted with the corresponding conductive channels 106. Consequently, the embedded package structure 1 as shown in FIG. 1 is fabricated.

It is noted that numerous modifications and alterations of the embedded package structure 1 may be made while retaining the teachings of the invention. Hereinafter, some variant examples of the package structure 1 will be illustrated with reference to FIGS. 3 to 5. Component parts and elements corresponding to those of the first embodiment are designated by identical numeral references, and detailed descriptions thereof are omitted.

Figure 3:
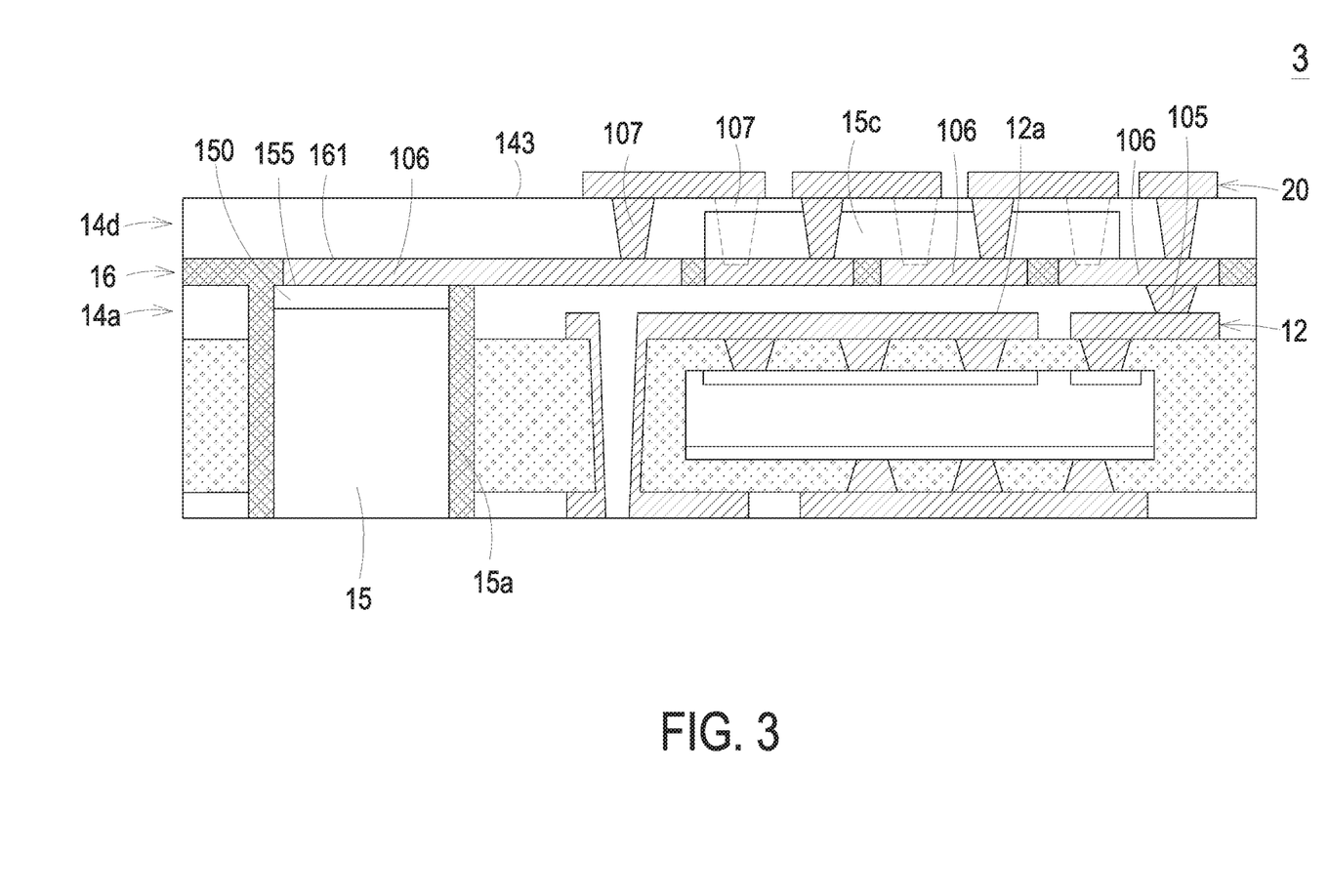
FIG. 3 is a schematic cross-sectional view illustrating an embedded package structure according to a second embodiment of the present invention.

FIG. 3 is a schematic cross-sectional view illustrating an embedded package structure according to a second embodiment of the present invention. In comparison with the first embodiment shown in FIG. 1, the passive component 15 of the embedded package structure 3 of this embodiment is completely accommodated within the opening 15a. In addition, the outer surface 155 of the passive component 15 is at the same level with the top surface of the first insulation material layer 14a, and the second conducting terminals 150 of the passive component 15 are in contact with the corresponding conductive channels 106. The conductive vias 105 is connected between the first conductive layer 12 and the corresponding conductive channel 106. Moreover, the embedded package structure 3 comprises a fourth insulation material layer 14d, a magnetic element 15c and a fifth conductive layer 20, but does not comprise the third conductive layer 17 and the fourth conductive layer 18. The fourth insulation material layer 14d is formed on the top surface 161 of the fixing structure 16. The magnetic element 15c is embedded within the fourth insulation material layer 14d and disposed on the top surface 161 of the fixing structure 16. The fifth conductive layer 20 is formed on a top surface 143 of the fourth insulation material layer 14d. In addition, the top surface 143 of the fourth insulation material layer 14d is partially exposed through the fifth conductive layer 20.

In this embodiment, plural conductive vias 107 are formed in the fourth insulation material layer 14d. The first ends of the conductive vias 107 are in contact with the corresponding conductive channels 106 of the fixing structure 16. The second ends of the conductive vias 107 are in contact with the fifth conductive layer 20. Similarly, the fifth conductive layer 20 is divided into one or more fifth conductive blocks by etching the fifth conductive layer 20. The fifth conductive blocks of the fifth conductive layer 20 are in contact with the second ends of the corresponding conductive vias 107.

Figure 4:
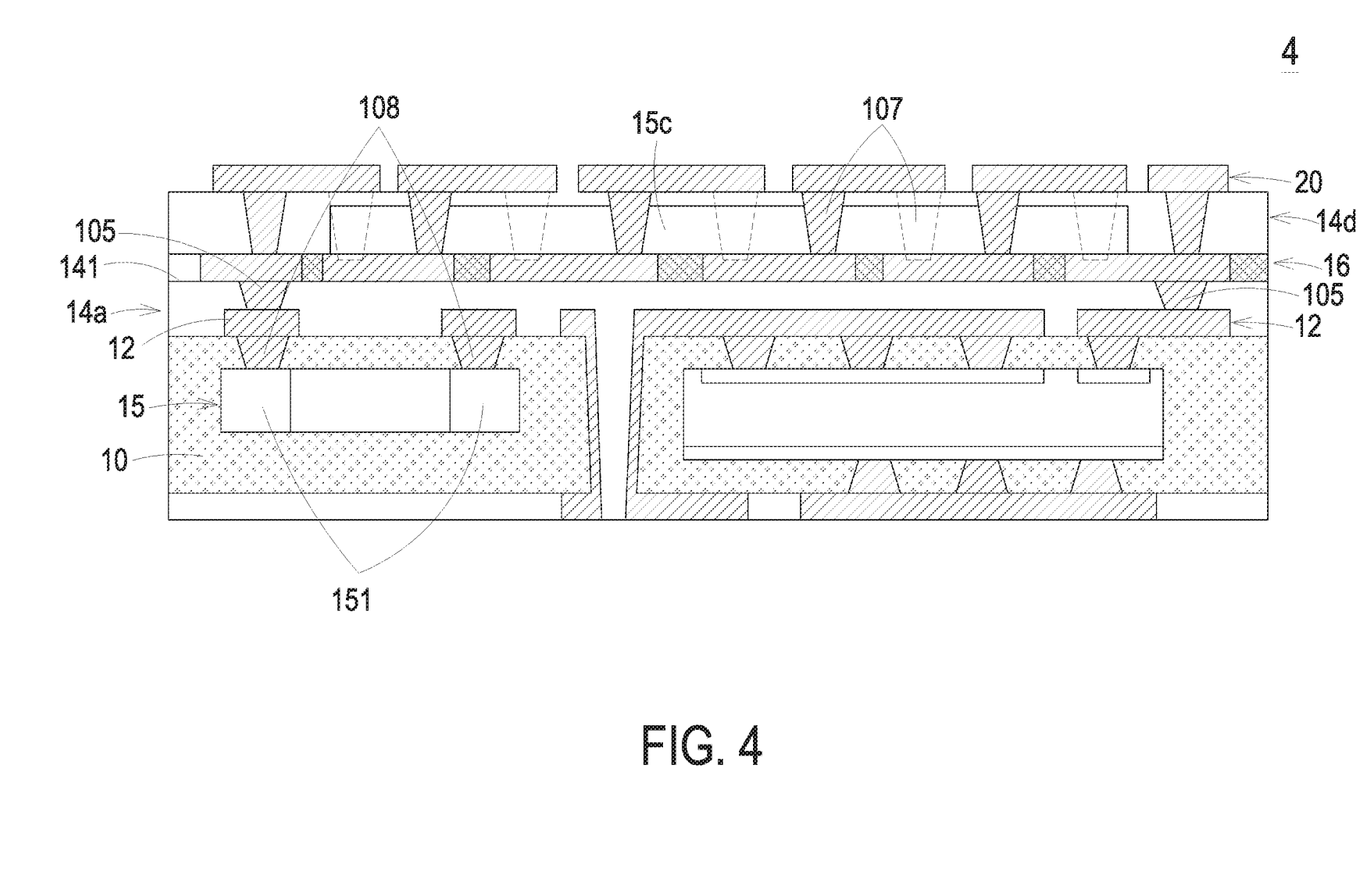
FIG. 4 is a schematic cross-sectional view illustrating an embedded package structure according to a third embodiment of the present invention.

FIG. 4 is a schematic cross-sectional view illustrating an embedded package structure according to a third embodiment of the present invention. In comparison with the first embodiment shown in FIG. 1, the passive component 15 of the embedded package structure 4 of this embodiment is completely embedded within the insulation substrate 10. Consequently, the fixing structure 16 is formed on the top surface 141 of the first insulation material layer 14a. Moreover, plural conductive vias 108 are formed in the insulation substrate 10. The first ends of the plural conductive vias 108 are in contact with the first conductive layer 12. The passive component 15 comprises plural second conducting terminals 151. The plural second conducting terminals 151 are in contact with the second ends of the corresponding conductive vias 108. Similarly, plural conductive vias 105 are formed in the first insulation material layer 14a. The conductive vias 105 are electrically connected with the corresponding conductive vias 108 through the first conductive layer 12. Similarly, the embedded package structure 4 further comprises the fourth insulation material layer 14d, the magnetic element 15c and the fifth conductive layer 20, but does not comprise the third conductive layer 17 and the fourth conductive layer 18. The arrangements of the fourth insulation material layer 14d, the magnetic element 15c and the fifth conductive layer 20 of the embedded package structure 4 are similar to those of the embedded package structure 3 of the second embodiment. The thickness of the magnetic element 15c of the embedded package structure 4 is substantially equal to the thickness of the magnetic element 15c of the embedded package structure 3. However, the width of the magnetic element 15c of the embedded package structure 4 is wider than that of the magnetic element 15c of the embedded package structure 3.

Figure 5:
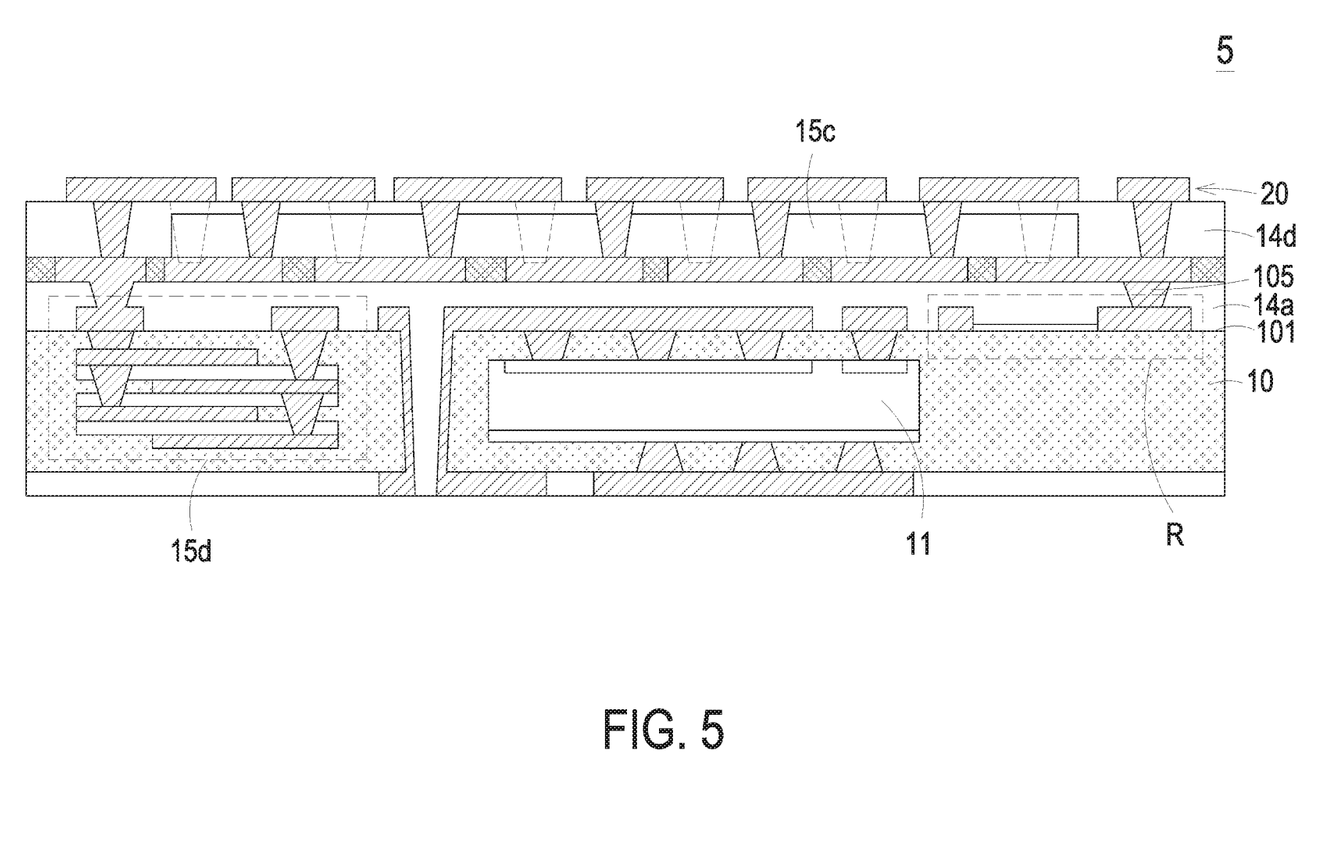
FIG. 5 is a schematic cross-sectional view illustrating an embedded package structure according to a fourth embodiment of the present invention.

FIG. 5 is a schematic cross-sectional view illustrating an embedded package structure according to a fourth embodiment of the present invention. In comparison with the fourth embodiment shown in FIG. 4, the passive component 15 of the embedded package structure 5 of this embodiment is directly formed by a semiconductor producing process. For example, a capacitor 15d is formed in the insulation substrate 10 and a resistor R is formed on the insulation substrate 10 by the semiconductor producing process. The location and arrangement of the capacitor 15d are similar to those of the passive component 15 as shown in FIG. 4. The resistor R is embedded within the first insulation material layer 14a and disposed on the top surface 101 of the insulation substrate 10. Moreover, the conducting terminals of the resistor R are in contact with the corresponding conductive vias 105. The arrangements of the fourth insulation material layer 14d, the magnetic element 15c and the fifth conductive layer 20 of the embedded package structure 5 are similar to those of the embedded package structure 4 of the third embodiment.

In the above embodiments, the overall thickness of the embedded package structure of the present invention is smaller than 1000 μm, preferably smaller than 800 μm, and the most preferably smaller than 600 μm. Moreover, since the electronic component and the passive component are horizontally embedded within the insulation substrate, the heat dissipating efficacy is enhanced.

From the above descriptions, the present invention provides an embedded package structure. An electronic component and a passive component are separately and horizontally embedded within an insulation substrate.

Consequently, the overall thickness of the embedded package structure is reduced, and the embedded package structure is suitably applied to the ultra-thin electronic product. The package structure of the embedded package structure is slim and easily fabricated. Moreover, the embedded package structure has high power density, good electrical properties and good heat management performance.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An embedded package structure, comprising:
   an insulation substrate having at least one first conductive via and at least one second conductive via;
   a first conductive layer formed on a top surface of the insulation substrate, wherein the first conductive layer is in contact with the at least first conductive via;
   a second conductive layer formed on a bottom surface of the insulation substrate, wherein the second conductive layer is in contact with the at least second conductive via;
   an electronic component embedded within the insulation substrate, and comprising plural first conducting terminals, wherein the plural first conducting terminals are electrically connected with the first conductive layer and the second conductive layer through the at least one first conductive via and the at least one second conductive via, respectively;
   a first insulation material layer formed on an outer surface of the first conductive layer and a part of the top surface of the insulation substrate;
   a second insulation material layer formed on an outer surface of the second conductive layer and a part of the bottom surface of the insulation substrate;
   a passive component located near a first side of the electronic component and separated from the electronic component, wherein the passive component is at least partially embedded within the insulation substrate, wherein the passive component further comprises at least one second conducting terminal, and the passive component is located beside the electronic component along a horizontal direction, wherein an outer surface of the passive component is at the same level with a top surface of the first insulation material layer;
   an opening, wherein the opening is located beside the electronic component, and the opening runs through the first insulation material layer, the second insulation material layer and the insulation substrate, wherein at least a part of the passive component is accommodated within the opening, wherein the opening is larger than the passive component, so that a gap is formed between the passive component and an inner surface of the opening;
   a fixing structure formed on the top surface of the first insulation material layer and the outer surface of the passive component, and filled in the gap between the passive component and the inner surface of the opening;
   a third insulation material layer formed on a top surface of the fixing structure;
   a magnetic element embedded within the third insulation material layer and disposed on the top surface of the fixing structure; and
   a third conductive layer formed on a top surface of the third insulation material layer, wherein a part of the top surface of the third insulation material layer is exposed through the third conductive layer.

2. The embedded package structure according to claim 1, further comprising:
   a third conductive layer formed on a top surface of the first insulation material layer, wherein a part of the top surface of the first insulation material layer is exposed through the third conductive layer;
   a fixing structure formed on the top surface of the first insulation material layer, an outer surface of the third conductive layer and an outer surface of the passive component, and filled in the gap between the passive component and the inner surface of the opening; and
   a fourth conductive layer formed on a top surface of the fixing structure, wherein a part of the top surface of the fixing structure is exposed through the fourth conductive layer.

3. The embedded package structure according to claim 2, wherein plural conductive channels are formed in the fixing structure, wherein the plural conductive channels are in contact with the third conductive layer and the corresponding second conducting terminal of the passive component.

4. The embedded package structure according to claim 3, wherein the fourth conductive layer is in contact with top surfaces of the plural conductive channels.

5. The embedded package structure according to claim 4, wherein plural third conductive vias are formed in the first insulation material layer, and the first conductive layer and the third conductive layer are electrically connected with each other through the plural third conductive vias, wherein the first conductive terminal on the top surface of the electronic component is electrically connected with the corresponding third conductive via through the corresponding first conductive via.

6. The embedded package structure according to claim 1, wherein plural conductive channels are formed in the fixing structure, wherein the plural conductive channels are in contact with the corresponding second conducting terminal of the passive component.

7. The embedded package structure according to claim 6, wherein plural third conductive vias are formed in the first insulation material layer, wherein the first conductive layer is electrically connected with the corresponding conductive channels through the corresponding third conductive vias.

8. The embedded package structure according to claim 7, wherein plural fourth conductive vias are formed in the third insulation material layer, wherein the third conductive layer is electrically connected with the corresponding conductive channels through the corresponding fourth conductive vias.

9. The embedded package structure according to claim 1, wherein the passive component is completely embedded within the insulation substrate, and the passive component comprises plural second conducting terminals.

10. The embedded package structure according to claim 9, wherein plural third conductive vias are further formed in the insulation substrate, wherein the first conductive layer is electrically connected with the corresponding second conducting terminals through the corresponding third conductive vias.

11. The embedded package structure according to claim 10, further comprising:

a fixing structure formed on a top surface of the first insulation material layer, wherein plural conductive channels are formed in the fixing structure;
a third insulation material layer formed on a top surface of the fixing structure;
a magnetic element embedded within the third insulation material layer and disposed on the top surface of the fixing structure; and
a third conductive layer formed on a top surface of the third insulation material layer, wherein a part of the top surface of the third insulation material layer is exposed through the third conductive layer.

12. The embedded package structure according to claim 11, wherein the first conductive layer is electrically connected with the corresponding conductive channels through plural fourth conductive vias in the first insulation layer.

13. The embedded package structure according to claim 12, wherein the third conductive layer is electrically connected with the corresponding conductive channels through plural fifth conductive vias in the third insulation layer.

14. The embedded package structure according to claim 13, further comprising a resistor, wherein the resistor is located near a second side of the electronic component, and disposed on the top surface of the insulation substrate, wherein the resistor is in contact with the corresponding fourth conductive via.

15. The embedded package structure according to claim 1, wherein the passive component is a capacitor, a resistor or an inductor.

16. An embedded package structure comprising:
a dielectric substrate having a first region and a second region adjacent to the first region;
an electronic component embedded within the first region of the dielectric substrate, and comprising plural first conducting terminals;
at least a first redistribution layer formed within the first region of the dielectric substrate and electrically connected to the electronic component;
a passive component embedded within the dielectric substrate and at least partially disposed within the second region of the dielectric substrate;
a second redistribution layer disposed on a surface of the dielectric substrate, the second redistribution layer being located in the first region and the second region and electrically connected with the passive component and the electronic component;
wherein a thickness of the passive component is larger than that of the electronic component, wherein the passive component further comprises at least one second conducting terminal, and the passive component is located beside the electronic component along a horizontal direction;
an opening, wherein the opening is located beside the electronic component, and the opening runs through the dielectric substrate, wherein at least a part of the passive component is accommodated within the opening, wherein the opening is larger than the passive component, so that a gap is formed between the passive component and an inner surface of the opening; and
a fixing structure formed on the outer surface of the dielectric substrate, and filled in the gap between the passive component and the inner surface of the opening, wherein plural conductive channels are formed in the fixing structure, wherein the plural conductive channels are in contact with the corresponding second conducting terminal of the passive component.

* * * * *